(12) United States Patent
Mondaeev et al.

(10) Patent No.: US 7,961,489 B2
(45) Date of Patent: Jun. 14, 2011

(54) COMPARING DATA REPRESENTATIONS TO STORED PATTERNS

(75) Inventors: Maxim Mondaeev, Givat-Ella (IL); Tal Anker, Modiin (IL)

(73) Assignee: Marvell Israel (MISL)Ltd., Yokneam (IL)

( * ) Notice: Subject to any disclaimer, the term of this patent is extended or adjusted under 35 U.S.C. 154(b) by 392 days.

(21) Appl. No.: 12/107,636

(22) Filed: Apr. 22, 2008

(65) Prior Publication Data

US 2009/0323383 A1 Dec. 31, 2009

Related U.S. Application Data

(60) Provisional application No. 60/913,437, filed on Apr. 23, 2007.

(51) Int. Cl.
*G11C 15/00* (2006.01)

(52) U.S. Cl. .................. 365/49.1; 365/49.17; 365/49.19

(58) Field of Classification Search .................. 365/49.1, 365/49.17, 49.19, 189.07
See application file for complete search history.

(56) References Cited

U.S. PATENT DOCUMENTS

| 3,742,460 | A | * | 6/1973 | Englund | .................. 365/189.07 |
| 6,137,707 | A | | 10/2000 | Srinivasan et al. | |
| 6,430,072 | B1 | * | 8/2002 | Chadwick et al. | ......... 365/49.15 |

* cited by examiner

*Primary Examiner* — Huan Hoang (57) ABSTRACT

A search engine includes a storage module to store a plurality of data patterns, a plurality of busses to receive a plurality of representations of a search word, a selector corresponding to at least one of the plurality of data patterns to select one of the plurality of representations of the search word for comparing to the at least one of the plurality of data patterns, and a logic circuit operatively coupled to the storage module, to the plurality of busses, and to the selector to compare the selected one of the plurality of representations of the search word to the at least one of the plurality of data patterns.

20 Claims, 7 Drawing Sheets

FIG. 9

COMPARING DATA REPRESENTATIONS TO STORED PATTERNS

CROSS REFERENCE TO RELATED APPLICATION

This application claims the benefit of U.S. Provisional Patent App. No. 60/913,437 entitled "Multiple Compare Bus for a Content Addressable Memory with Selection Functionality Per CAM Row," filed Apr. 23, 2007, the disclosure of which is hereby expressly incorporated herein by reference.

FIELD OF TECHNOLOGY

The present disclosure relates generally to Content Addressable Memory or Ternary Content Addressable Memory and, more particularly, to efficiently comparing data to information stored in memory.

BACKGROUND

Content Addressable Memory ("CAM") is used in a variety of applications which require fast and efficient searching for data. In general, CAM is a storage device with a dedicated logic for executing a parallel search for a data word. CAM accepts the data word as a parameter and returns zero or more addresses in CAM at which this data word is stored. In this sense, CAM can be thought of as an inverse of a Random Access Memory (RAM) which returns data stored at a specified address. Typically, a CAM module compares the search word to all stored patterns within a single clock cycle.

Ternary Content Addressable Memory ("TCAM") offers additional flexibility by storing one or more bits of a block data in the so-called "don't care" state. When searching for a specified data word, TCAM returns a match indication for a bit stored in this state irrespective of the value of the corresponding bit in the specified search word. For example, if a TCAM unit stores the value 0X01 at a certain address, where X indicates a "don't care," the TCAM may unit return this address when the specified search word is 0001 or 0101.

One category of applications which may use CAM includes anti-virus systems and a Network Intrusion Detection system such as one described in U.S. patent application Ser. No. 12/031,130 entitled "Method and Apparatus for Deep Packet Inspection for Network Intrusion Detection," filed Feb. 14, 2008. This system may be used, for example, to detect patterns in one or more streams of data. Further, a known technique of detecting network intrusion involves software-based pattern recognition employing, for example, the industry standard "snort" rules that are applied to message headers. This intrusion detection methodology may be applied to either incoming or outgoing traffic. As part of analyzing data traffic, a system executing snort rules may similarly compare a data word to a certain pattern.

Other examples of systems using CAM or TCAM modules include routing devices, databases, and data compression systems.

SUMMARY

In one embodiment, a multiple compare content addressable memory unit may include a storage module for storing a plurality of data patterns, a plurality of busses to receive a plurality of representations of a search word, a selector corresponding to at least one of the plurality of data patterns to select one of the plurality of representations of the search word for comparing to the at least one of the plurality of data patterns, and a logic circuit operatively coupled to the storage module, to the plurality of busses, and to the selector to compare the selected one of the plurality of representations of the search word to the at least one of the plurality of data patterns.

In another embodiment, a method for determining whether a search word matches one or more of a plurality of data patterns stored in a content addressable memory may include receiving a first representation of the search word, generating at least a second representation of the search word distinct from the first representation of the search word, and comparing the first representation and the second representation to the plurality of the patterns.

In another embodiment, a circuit for comparing a data pattern to a plurality of representations of a search word may include a data word input for receiving the data pattern, a plurality of search word inputs for receiving a plurality of representations of the search word, a multiplexer coupled to the plurality of search word inputs for selecting one out the plurality of representations of the search word, and a comparator coupled to the data word input and to the multiplexer for comparing the data word input to the selected one of the plurality of search words.

In another embodiment, a search engine for performing a search on a stream of data includes a parser to parse blocks of data in the data stream to be searched and a memory unit having a plurality of rows each storing a respective data pattern, such that each row includes a plurality of pattern storage blocks to store sub-units of a data pattern, a multiplexer having a plurality of inputs coupled to a plurality of search word busses to receive a plurality of representations of a search word from the parser, and a plurality of comparators coupled to the plurality of pattern storage blocks and an output of the multiplexer.

In yet another embodiment, a system for detecting one of a match or mismatch between a search word and a plurality of data patterns may include a first bus for receiving a first representation of the search word, a first converter coupled to the first bus to generate a second representation of the search word on a second bus different from the first representation, a content addressable memory unit to store the plurality of data patterns and configured to output indications of a match between the plurality of data patterns and the first representation of the search word or the second representation of the search word, and at least one multiplexer coupled to the first bus and to the second bus to select between the first representation of the search word and the second representation of the search word to be compared to a stored data pattern.

DETAILED DESCRIPTION

Figure 1:
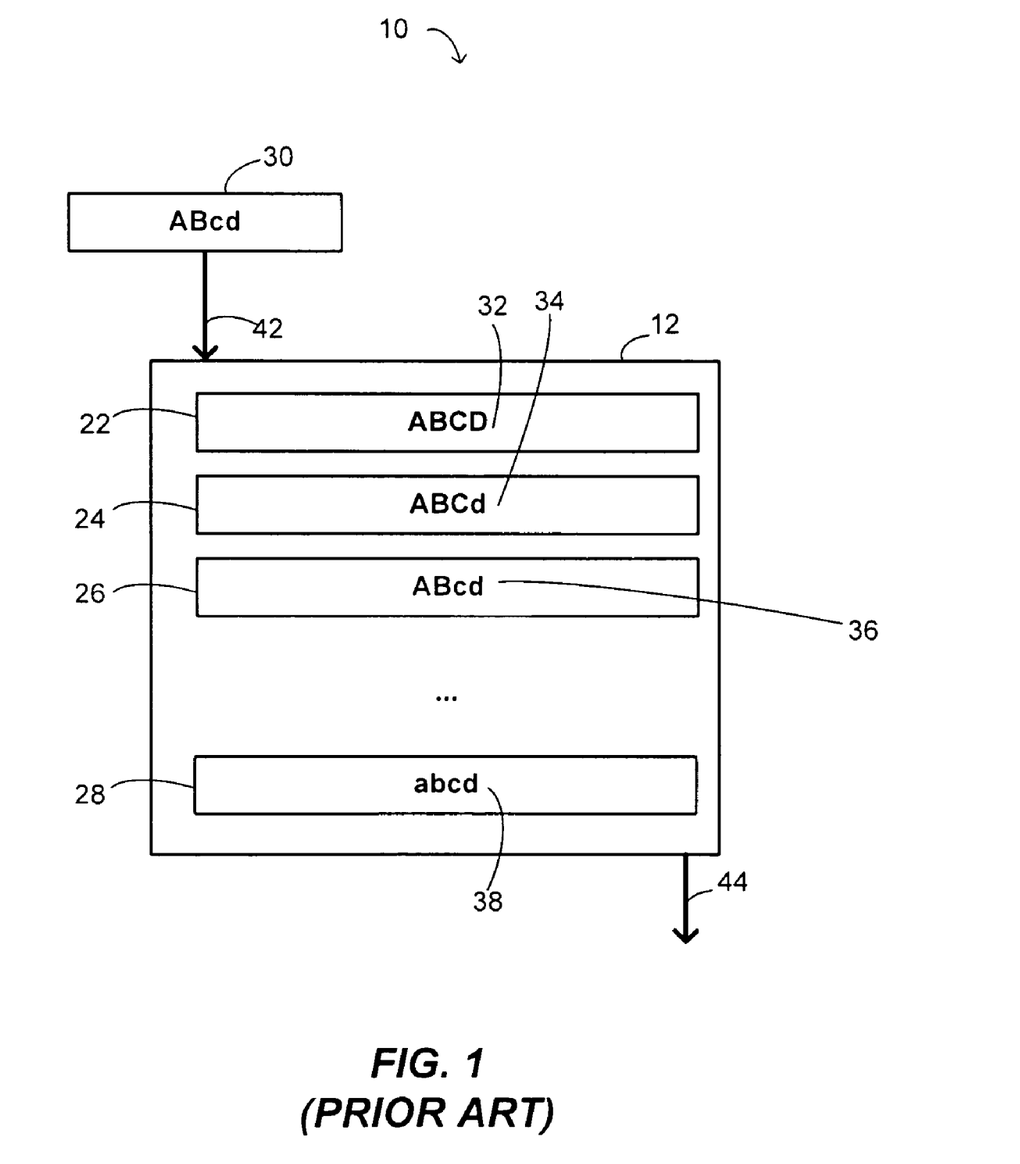
FIG. 1 is a block diagram illustrating a known CAM device operating in a system for comparing a data word to several values stored in the CAM device.

FIG. 1 is a block diagram illustrating a prior art packet inspection system 10 using a prior art content addressable memory (CAM) unit 12 including individual entries 22-28 to compare a search word 30 to the data patterns 32-38. In operation, the system 10 may supply the search word 30 to the CAM unit 12 via a comparand bus 42 and receive an address of a pattern matching the search word 30 via an output bus 44. A CAM such as the CAM unit 12 typically compares the search word 30 to data stored in each of the entries 22-28 within a single clock cycle or, at least, in parallel with every other entry 22-28.

Generally speaking, a known CAM such as the CAM unit 12 stores each data pattern 32-38 as a separate entry 22-28. In the example illustrated in FIG. 1, the entry 22 stores the pattern "ABCD" while the entry 24 stores the pattern "ABCd" even though the entries 22 and 24 include the same characters and differ only in the type case of the letter "d." Thus, if the packet inspection system 10 compares the search word "ABcd" to the data pattern 32-38 stored in the respective entries 22-28, the system 10 will detect a match only between the search word 30 and the pattern 36.

To continue with the example illustrated in FIG. 1, the system 10 may include a memory (not shown) storing computer instructions and a processor (not shown) to execute computer instructions. These instructions may implement, for example, Sourcefire Vulnerability Research Team (VRT) Certified Rules, typically referred to as SNORT® rules, which today are a de-facto standard in intrusion detection. SNORT® rules specify various relationships between data patterns, regular expressions, etc. which, if found in a data stream or a data packet, may indicate unauthorized content. The data patterns are often presented in American Standard Code for Information Interchange (ASCII) format. For example, a SNORT® rule may be formatted as follows:

alert tcp $EXTERNAL_NET any->$HTTP_SERVERS $HTTP_PORTS
(msg: "WEB-MISC xp_cmdshell attempt"; flow: to_server, established; content: "xp_cmdshell"; nocase;)

This rule requires that the system 10 check all TCP traffic flowing to any HTTP ports for the ASCII pattern "xp_cmdshell," and the nocase directive further indicates that this pattern is not case-sensitive. Assuming the entire pattern "xp_cmdshell" fits into any one of the entries 22-28, the system 10 must store the patterns "Xp_cmdshell," "XP_cmdshell," . . . "XP_CMDSHELL" in separate entries 22-28 to implement the part of the rule requiring a case-insensitive comparison with the data pattern. Accordingly, the content addressable CAM unit 12 requires 210 entries to accommodate all upper- and lower-case variations of the 10-letter pattern "xp_cmdshell." Providing or utilizing a CAM that can store so many entries may not be practical. Moreover, as part of executing this rule on a system 10, a processor must first generate every valid permutation "Xp_cmdshell," "XP_cmdshell," etc., so that they can then be stored in the CAM 12.

Meanwhile, some statistical analyses have shown that almost half of the content rules (i.e., rules that require checking for a data pattern match) are case-insensitive. In some cases, a rule or an instruction may require both a case-sensitive and a case-insensitive search for the same search word 30. Moreover, type case variations of text are only one of many examples of representing the same information as different sequences of binary data.

Figure 2:
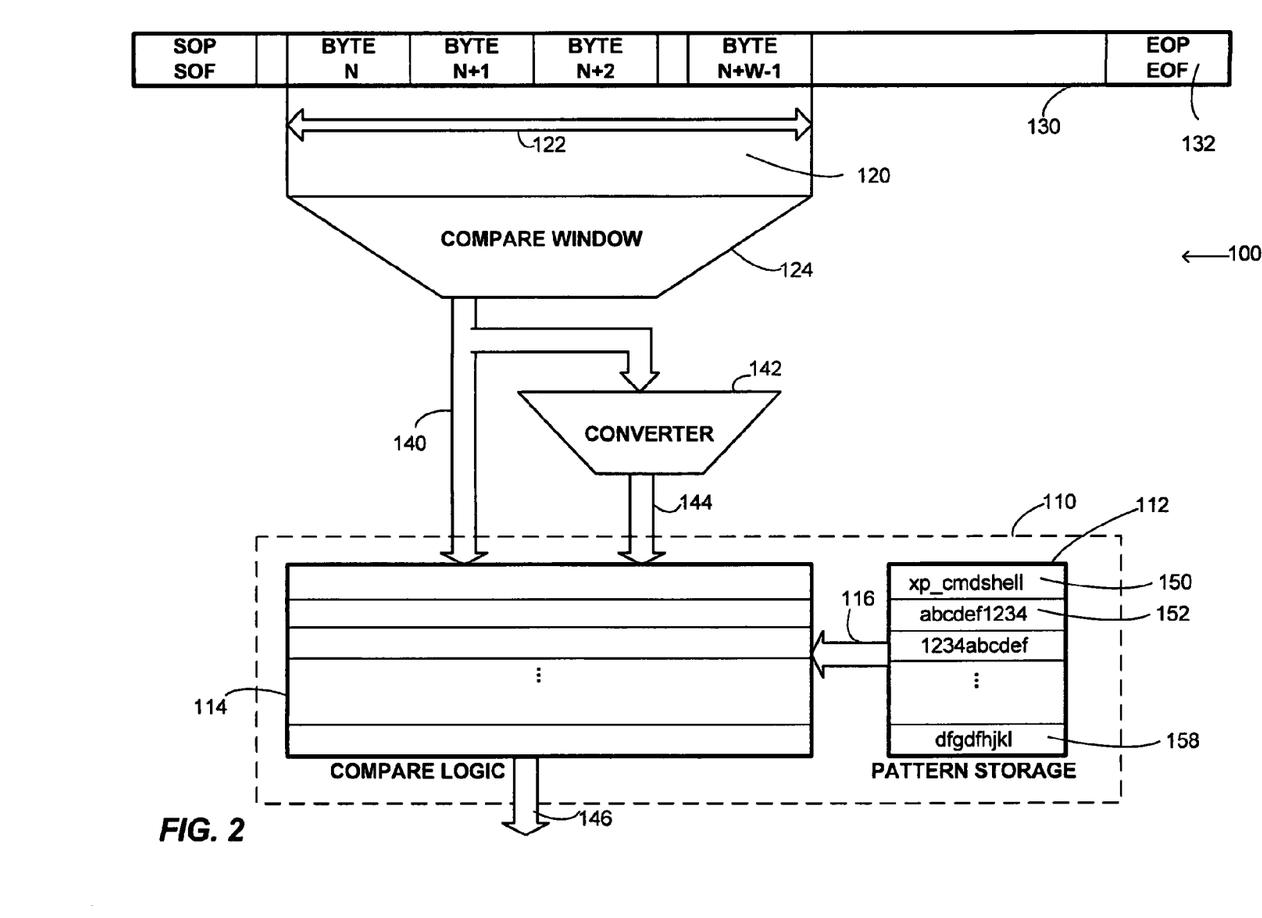
FIG. 2 is a block diagram illustrating a system for comparing multiple representations of a search word to a plurality of data patterns.

FIG. 2 illustrates an example system 100 for comparing multiple representations of a search word in accordance with one embodiment. The system 100 may include a multiple compare CAM unit 110 having a storage module 112 for storing several data patterns in separate rows and a logic circuit 114 for comparing the data patterns to several presentations of a search word 120, connected to the storage module 112 via a memory bus 116. As used herein, the term "search word" refers to a block of data of any length. For example, the search word may 120 may be a sequence of 32, 64, 128, etc. bytes. In other embodiments, the search word may include multiple kilobytes of data or, conversely, may be as small as only several bytes or even bits. As illustrated in FIG. 2, a length 122 of the search word 120 corresponds to a size of a sliding window 124. In operation, the system 100 may analyze a data packet, a data stream, a file, etc. (e.g., the data packet 130) by applying the sliding window 124 to block of data of length 122, extracting the search word 120, comparing one or several representations of the extracted search word 120 to one or more patterns stored in the storage module 112, generating a match or no-match indication, and advancing the sliding window 124 by a discrete number of bytes in the direction of the byte 132. A parser (not shown) may parse the data stream to extract one or multiple search words 120 based on a source or a destination address associated with the data stream, communication protocol associated with the data stream, or other principles. The byte 132 may be an end-of-packet byte, an end-of-file byte, or any other indication of a tail of a grouping of data. Further, in an embodiment, the sliding window 124 advances by a single byte after each comparison in order to examine every pattern which may be included in the data packet 130. However, other embodiments of the system 100 may advance the sliding window 124 by a different number of bytes or bits, such as eight bytes in accordance with an address alignment requirement of a certain file system, to take one example.

Upon extracting the search word 120, the system 100 may supply the unchanged representation of the search word 120 to the multiple compare CAM unit 110 via a comparand bus 140. Additionally, the system 100 may supply the search word 120 to one or more converters 142 to generate alternative representations of the search word 120. In the example illustrated in FIG. 2, a converter 142 supplies an alternative representation of the search word 120 to another input of the multiple compare CAM unit 110 via a comparand bus 144. As discussed in greater detail below, the logic circuit 114 may compare each of the data patterns in the storage module 112 to one of the representations received via the comparand busses 140 and 144 and generate a match result 146.

In some embodiments, the converter 142 may convert data into a common form or format. For example, in one specific embodiment, the converter 142 may convert every ASCII character included in the search word 120 to the lower case. Thus, if the search word 120 includes the string "xP_cmDsHelL" encoded in ASCII, the converter 142 may output a converted string "xp_cmdshell" on the comparand bus 144. The converter 142 may help eliminate many entries in the storage module 112 for patterns that are not case sensitive. For example, instead of having to store multiple patterns such as "Xp_cmdshell," "xP_cmdshell," "xp_Cmdshell," etc. in the storage module 112, it may be sufficient to merely store "xp_cmdshell." In an embodiment, the converter 142 implements the conversion at a wire speed of input data using hardware components without software to maintain a relatively high speed at which the sliding window 124 can propagate through the packet 130. However, in other embodiments, the converter 142 may also include any suitable combination of other components including software and/or firmware, provided that suitable high speed is maintained.

In other embodiments, the converter 142 may convert every ASCII character included in the search word 120 to another standard representation such as upper case, for example. Thus, the storage module 112 may store "XP_CMDSHELL" as a single entry and system 100 may properly detect a match between "XP_CMDSHELL" and each of the patterns "Xp_cmdshell," "xP_cmdshell," "xp_Cmdshell," etc.

It will be noted that in some embodiments, the converter 142 may also convert the search word 120 to a certain format from several possible original formats. To this end, the converter 142 may also identify the original encoding. For example, a system 100 may operate as a component of a packet processor or a router that detects network intrusion attempts from hosts on the World Wide Web (i.e., the Internet), including unauthorized email messages which contain a certain text string such as "You won the lottery!" Because an email message may be encoded using various encoding standards such as ASCII, Unicode Transformation Format 8 (UTF-8), UTF-16, UTF-32, etc., the system 100 may store the text string as a single ASCII string in the storage module 112, use several the converters 142 to determine whether the search word 120 is encoded using ASCII, UTF-8, UTF-16, etc. and convert the search word 120 to ASCII in accordance with the corresponding conversion rules. In other embodiments, the system 100 may also use multiple converters 142 to generate several alternative representations of the data word 120. Moreover, combinations of the approaches are also possible, with some or all of several converters 142 converting data from multiple source formats to a single format of a data pattern stored in the storage module 112.

Figure 3:
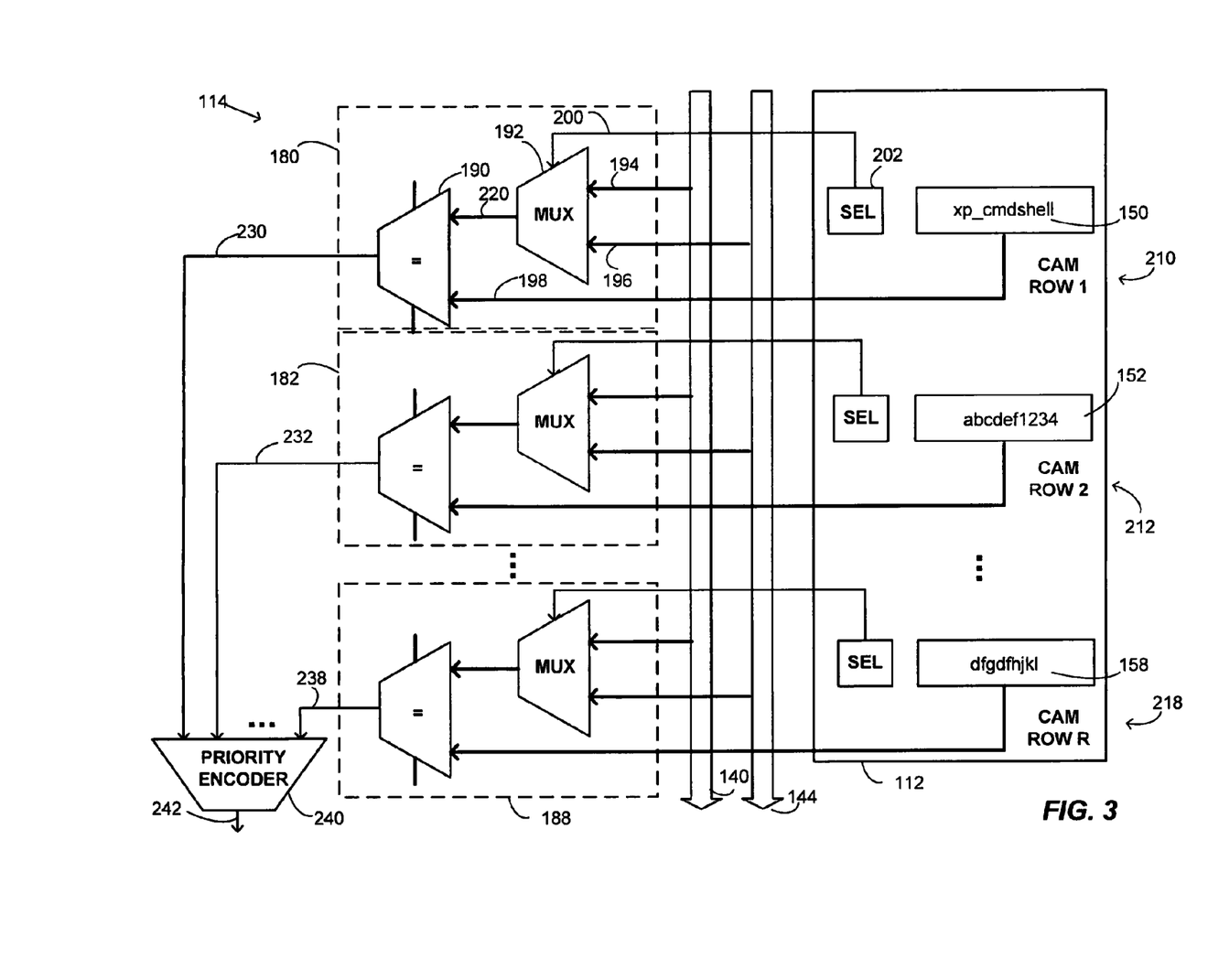
FIG. 3 is a block diagram illustrating a multiple compare CAM unit which may be used in the system illustrated in FIG. 2.
Figure 4:
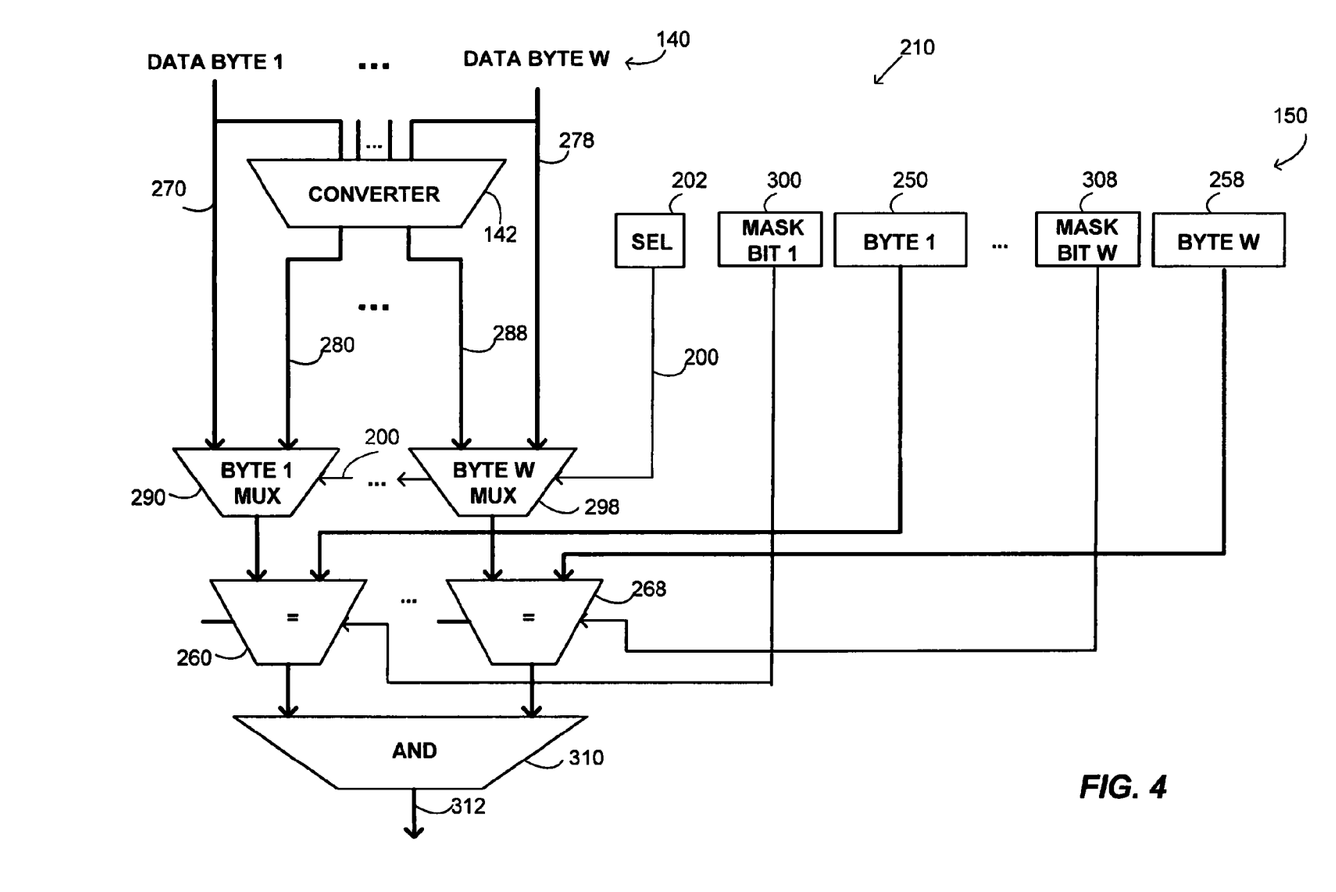
FIG. 4 is a block diagram providing a more detailed view of a row of the multiple compare CAM unit illustrated in FIG. 3.

With continued reference to FIG. 2, the multiple compare CAM unit 110 may compare in parallel each of the data patterns 150-158 to either the unchanged representation of the search word 120 or the alternative representation of the search word 120 supplied via the busses 140 and 144, respectively. Depending on a desired system configuration, the unchanged representation of the search word 120 and the alternative representation of the search word 120 may be compared to data patterns 150-158 in the same cycle or in successive cycles. As discussed in detail below, the logic circuit 114 may include a separate independently operable sub-circuit or row, schematically demarcated by horizontal lines in the logic circuit 114 and corresponding to each of the data patterns 150-158. In this embodiment, each of the data patterns 150-158 may additionally store a selection indicator (not shown) specifying from which of the busses 140 and 144 the logic circuit 114 should retrieve a representation of the search word 120 for comparison to the corresponding data pattern 150-158. For example, the selection indicator corresponding to the data pattern 150 (e.g., "xp_cmdshell") may require a comparison with the search word 120 converted into lower-case ASCII, while another selection indicator corresponding to the data pattern 152 may direct the logic circuit 114 to compare the data pattern 152 to the unchanged search word 120. As another example, an unchanged representation of the search word 120 may be compared to the first n rows in CAM unit 110, while the unchanged representation of the search word 120 may be compared to the next m rows in the CAM unit 110. FIGS. 3 and 4 further illustrate several details of the operation of the logic circuit 114.

Referring to FIG. 3, the logic circuit 114 may include several comparators 180-188 for comparing the individual data patterns 152-158. In accordance with one embodiment, the number of comparators 180-182 may be the same as the number of rows of the storage module 112, so that a separate comparator 180-188 processes a corresponding one of the data patterns 150-158 in parallel with every other comparator 180-188, which may be within a single clock cycle, for example. In an alternative embodiment, there may be less comparators than rows of storage. As yet another alternative, one or more rows may share a comparator (e.g., on a time-share basis). In these alternatives, a smaller CAM may be employed; however, data will need to be loaded in successive cycles requiring a larger number of cycles to complete a comparison operation. As illustrated in FIG. 3, each of the comparators 180-188 may include a comparator 190, a multiplexer 192, at least two search word inputs 194 and 196, and a data word input 198, and a selection input 200. More specifically, the search word inputs 194 and 196 may connect the busses 140 and 144 to the two inputs of the multiplexer 192 and the selection input 200 may supply the value of a corresponding selection indicator 202 to the multiplexer 192. Each of the comparators 180-188 along with a corresponding selection indicator 202 and a section of the storage unit 112 storing a data pattern 150-158 may define an individual CAM row 210-218. In other words, an individual CAM row 210-218 may include a logic portion and a storage portion.

In the particular example illustrated in FIG. 3, the selection input 200 may be a single bit and each of the data word and search word inputs 194-198 may be a multi-byte (e.g., 32 bytes) connection. However, other sizes of the inputs 194-200 are also possible. For example, the number of bits of the selection input 200 may correspond to the number of comparand busses so that a value on the selection input 200 may unambiguously identify the necessary bus.

The value supplied via the selection input 200 may thus determine which of the at least two representations of the search word 120 (such as the unchanged representation or the representation generated by the converter 142) the multiplexer 192 will supply as an input 220 to the comparator 190. The comparator 190 may, in turn, determine whether the data received via the input 220 is identical to the data pattern 150 received via the data word input 198.

In the example discussed above with reference to FIG. 2, for example, the data pattern 150 such as "xp_cmdshell" may correspond to a lower-case ASCII analysis of the data packet 130 and the selection indicator 202 accordingly indicates that the logic circuit 114 should use the data on the comparand bus 144 when comparing to the data pattern 150 to the search word 120. Thus, the comparator 180 may output a value indicating a match via an output 230 even though the search word 130, in its original format, may be "xP_cmDsHelL," for example.

The comparators 182-188 may include components similar to the components 190-200 and 220 discussed above. Each of the outputs 230-238 may supply a match indication to a priority encoder 240 to determine whether one of the presentations of the search word 120 matches at least one of the data patterns 150-158 and, if the comparators 182-188 detect more than one match, output an order identifier of the first match. In other words, the data patterns 150-158 may be ordered in the storage module 112 so that the data pattern 150 has a priority over the data pattern, for example. It will be appreciated that in many applications, such as intrusion detection involving SNORT® rules, the order in which patterns are detected may have an impact on the efficiency and/or accuracy of analysis because a detected match with a certain pattern may trigger further analysis of "dependent rules" which may involve additional patterns.

In some embodiments, the logic circuit 114 may not include a comparator 180-188 for every data pattern 150-158. Correspondingly, the storage module 112 may include the selection indicators 202 for only some of the data patterns 150-158. In these embodiments, the multiple compare CAM unit 110 may allow a selection of comparand busses only for the data patterns stored in certain rows of the storage unit 112. For the remaining rows, the multiple compare CAM unit 110 may implement a default comparison between the data on the bus 140 (i.e., unchanged representation of the search word 130) and the corresponding data pattern. It is noted that in some embodiments, the CAM unit 110 may be arranged so that the unchanged data on the bus 140 only communicates with a first set of n rows, and the alternative data on the bus 144 only communicates with a second set of m rows, thus obviating the selectors 202 and the multiplexers 192.

Additionally, it is contemplated that in some embodiments, the comparand busses 140 and 144 need not carry the same amount of information. For example, the comparand bus 144 may carry an expanded version of the search word 120 such as in case of a UTF-8 to UTF-16 conversion. The logic circuit 114 may accordingly implement padding or another suitable technique to properly compare a data word to one of the representations supplied via several differently sized comparand busses.

FIG. 4 provides a more detailed view of a multi-byte embodiment of an individual row of a multiple compare CAM unit 110 such as the row 210 of FIG. 3. In particular, FIG. 4 illustrates several data bytes 250-258 (Data Byte 1, . . . , Data Byte W) of a data pattern 150 stored in the row 210, with each of the bytes 250-248 connected to a corresponding sub-unit comparator 260-268. Alternatively, the row 210 may use other size data blocks (e.g., 2-byte data blocks, 4-byte data blocks, etc.) which accordingly may be connected to block comparators instead of the data bytes 250-258. In this example, the comparand bus 140 includes the individual bytes 270-278 of the search word 120 which are supplied to the converter 142 which, in turn, supplies the converted bytes 280-288 to the respective multiplexers 290-298. Of course, other embodiments of the multiple compare CAM unit 10 may include converters which supply fewer or more bits to the multiplexers 290-298 for each byte of the data bytes 270-278. However, this particular example illustrates the case of a one-byte-to-one-byte conversion.

The single selection input 200 may control each of the multiplexers 290-298 because the logic circuit 114 compares the entire data pattern 150 to one of the representations of the search word 130. In other embodiments, the selection indicator 202 may include a greater number of bits and may separately control different groups of multiplexers or even individual multiplexers. For example, the selection indicator may direct the multiplexors 290-298 to compare the first 16 bytes of a 32-byte word to the data on the bus 140 and compare the last 16 bytes to the data on the bus 144. Meanwhile, each ternary selector (or mask bit) 300-308 may operate on a byte level and control one of the bytes 250-258. In particular, the mask bit 300-308 may either enable or disable the operation of the corresponding comparator 260-268 to thereby allow ternary (i.e., "don't care") comparison on one or more bytes of the data pattern 150. In this particular embodiment, each of the ternary selectors 300-308 may be a single bit. Alternatively, each of the ternary selectors 300-308 may be a bit mask enabling comparison on a bit level. In at least some of the embodiments, a comparator 260-268 may output a match indication when disabled by the corresponding mask bit 300-308.

With continued reference to FIG. 4, an AND logical operator 310 may collect the outputs of the sub-unit comparators 260-268 to generate a single match indication 312, which may be a binary output. Thus, to generate a positive match on one of the representations of the search word 130, every sub-unit comparator 260-268 must produce a positive indication.

Generally, with reference to FIGS. 2-5, it will be appreciated that the multiple compare CAM unit 110 may be provided as an integral circuit or several components. For example, the storage module 112 may be manufactured as a separate component for storing several data patterns along with selection indicators 202 and, possibly, ternary selectors 300-308. Depending on the desired application of the storage module 112, this module may be a CAM, TCAM, or RAM type of memory. For example, the storage module 112 (FIG. 2) in one embodiment may be a RAM unit and the memory bus 110 may support loading multiple data patterns from the storage unit 112 to the logic circuit 114. Similar to the storage module 112, the logic circuit 114 may be provided as a separate module for selectively comparing data on several comparand busses to multiple patterns as generally discussed above. Moreover, it is contemplated that various parameters of the logic circuit 114 may be specifically tailored to various applications during manufacturing. For example, some systems may generally require comparing, to one or more data patterns, the original or unchanged representation of the search word 130 and only one alternative representation of the search word 130 which may be a standardized or normalized representation of this word (e.g., a lower-case ASCII string). In other applications, it may be necessary to compare more than two representations of the search word 130 to several data patterns.

In some embodiments, the multiple compare CAM unit 110 may be provided as a single integrated circuit. Preferably but not necessarily, each row of the multiple compare CAM unit 110 may be capable of comparand bus selection and, in some cases, each row may be additionally provided with ternary selection capability for each group of bytes, a single byte, or even an individual bit. In yet other embodiments, the multiple compare CAM unit 110 may be integrated with one or more special purpose converters 142. For example, a variety of routing, network intrusion detection, database searching, and similar applications may require a similar converter 142 such as one for type-case conversion. In other embodiments, the converter 142 may be external to a chip or circuit having a multiple compare CAM unit 110 and may even be implemented as a software component. Further, some embodiments of the converter 142 may include a programmable unit such as a Field-Programmable Gate Array (FPGA) or a Programmable Logic Array (PLA), for example.

Figure 5:
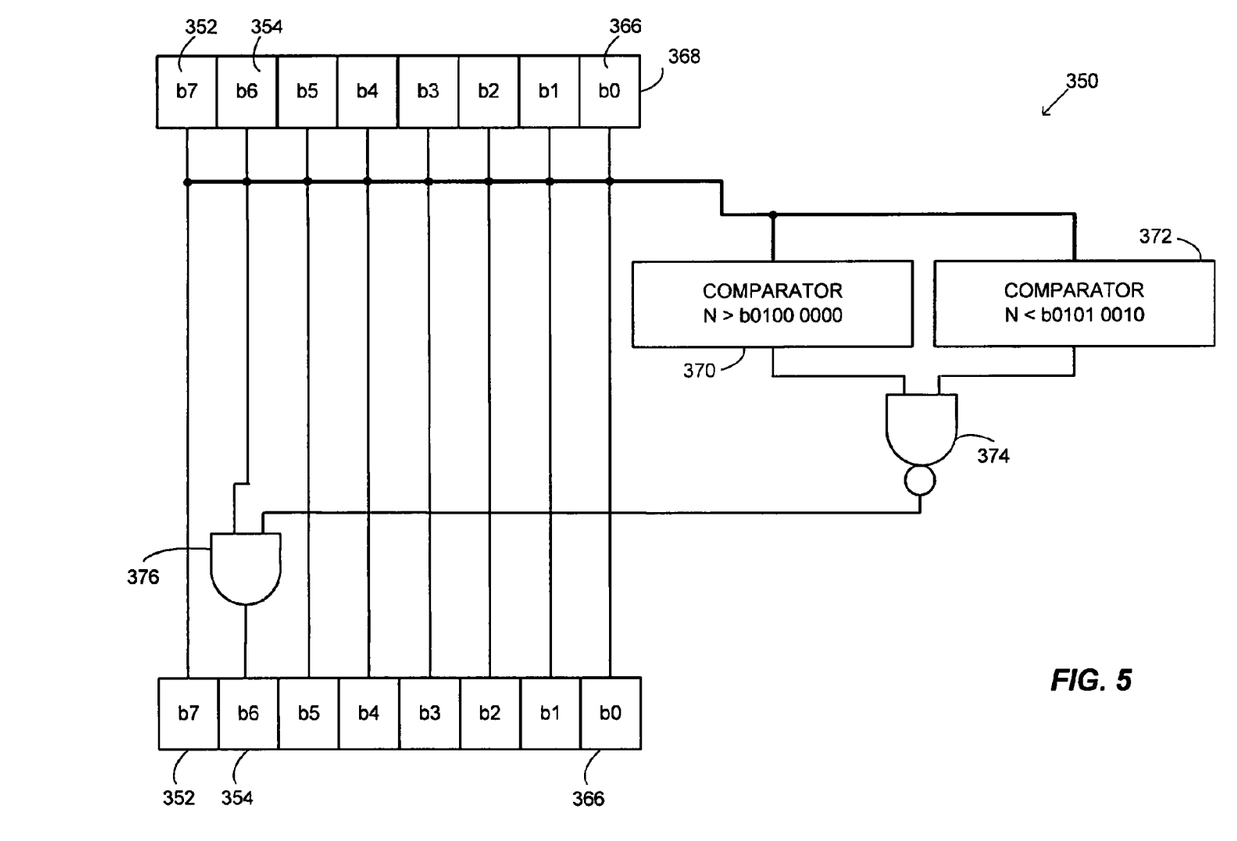
FIG. 5 is a block diagram illustrating a comparator which may be used in the system illustrated in FIG. 2.

Finally, as one example of the conversion 142, FIG. 5 illustrates a circuit 350 for detecting whether a byte of data stores an ASCII character and converting the ASCII to the lower type case. For example, the circuit 350 may leave the binary value 1110 1010 intact because this value does not correspond to one of the ASCII characters "A" to "Z." Meanwhile, the circuit 350 may convert the binary value 0100 0001 ("A") to 0110 0001 ("a"). To this end, the circuit 350 may supply the bits 352-366 of a byte 368 to the comparators 370 and 372 which may determine whether the byte 368 belongs to the upper-case character range of ASCII. As illustrated in FIG. 5, the NAND gate 374 and the AND gate 376 may set the bit 354 to zero if the original value of the bit 354 is "1" and if the comparators 370 and 372 determine that the byte 368 is within the upper-case ASCII character range. However, it is noted that the circuit 250 is provided by way of illustration only.

Referring back to FIG. 2, the components 110, 140, 142, and 144 in one embodiment may be provided as an integral circuit or a chip to thereby eliminate an additional hardware design stage or a programming effort. Moreover, integral circuits including the components 110, 140, 142, and 144 may be customized to a particular type of application. For example, a server servicing a database may use an integral circuit with a single lower-case-to-upper-case converter 142. Meanwhile, a packet router may use an upper-case-to-lower-case converter 142, and a network intrusion detection system of a certain packet processor may use a UTF-16-to-UTF-8 converter 142.

Figure 6:
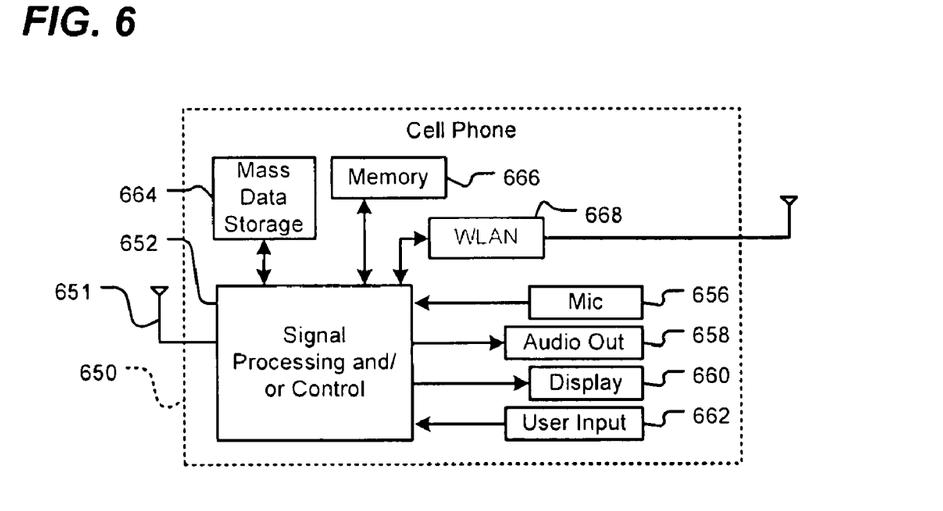
FIG. 6 is a block diagram of a cellular phone that may utilize a method and system for comparing a data word to several values stored in a CAM device such as described herein.

Referring now to FIGS. 6-9, various example devices will be described that may utilize a method and system for comparing a data word to several values stored in a CAM device such as described above. Referring now to FIG. 6, a method and system for comparing unchanged and alternative data words to values stored in a CAM device such as described above may also be utilized in a cellular phone 650 that may include a cellular antenna 651. The cellular phone 650 includes signal processing and/or control circuits, which are generally identified in FIG. 6 at 652, a WLAN interface 668, and a mass data storage 664. A method and system for comparing a data word to several values stored in a CAM device may be implemented in the signal processing and/or control circuits 652 and/or the WLAN interface 668, for example, as part of a system to detect patterns in signals received via the antenna 651 or the WLAN or in data stored in the mass data storage 664, to detect malicious data such as viruses, worms, etc., for content filtering, for digital rights management, etc. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices for example hard disk drives HDD and/or DVDs. Cellular phone 650 may be connected to memory 666 such as RAM, ROM, low latency nonvolatile memory such as flash memory and/or other suitable electronic data storage. Cellular phone 650 also may support connections with a WLAN via a WLAN network interface 668.

Figure 7:
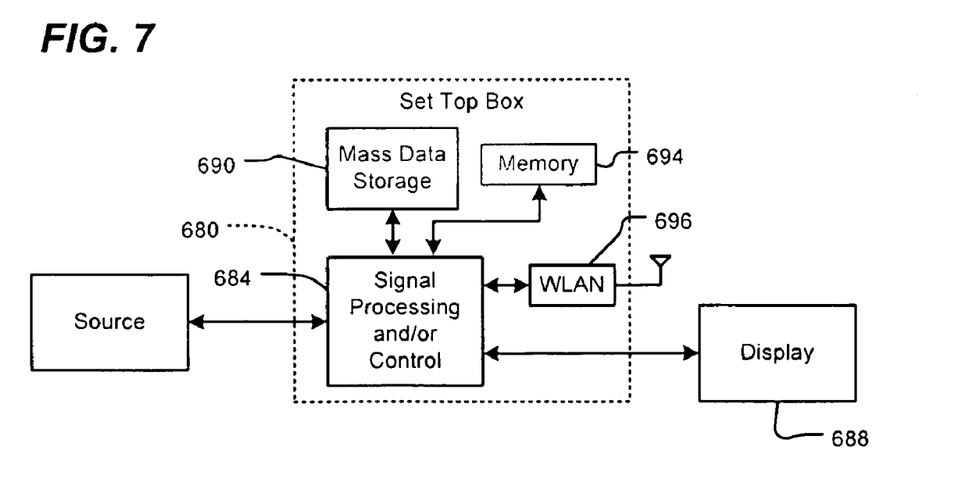
FIG. 7 is a block diagram of a set top box that may utilize a method and system for comparing a data word to several values stored in a CAM device such as described herein.

Referring now to FIG. 7, a method and system such as described above may be utilized in a set top box 680. The set top box 680 includes signal processing and/or control circuits, which are generally identified in FIG. 7 at 684, a WLAN interface 696, and a mass data storage device 690. A method and system for comparing unchanged and alternative data words to several values stored in a CAM device may be implemented in the signal processing and/or control circuits 684 and/or the WLAN interface 696, for example, as part of a system to detect patterns in signals received via the WLAN or in data stored in the mass data storage 690, to detect malicious data such as viruses, worms, etc., for content filtering, for digital rights management, prevent theft of personal or proprietary information exchanged between the set top box 680 and a corresponding infrastructure element, etc. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Figure 8:
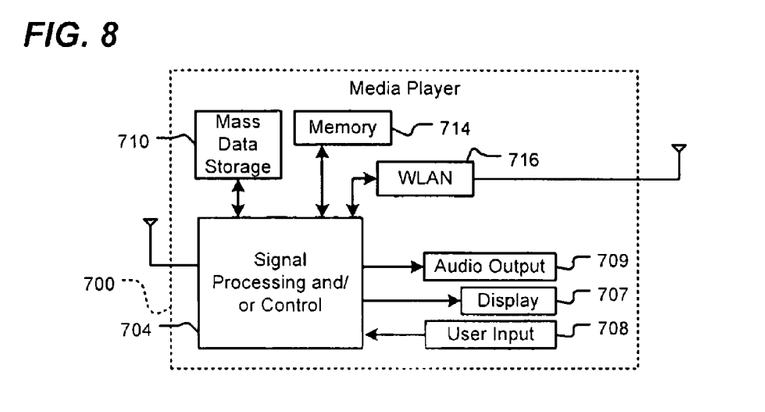
FIG. 8 is a block diagram of a media player that may utilize a method and system for comparing a data word to several values stored in a CAM device such as described herein.

Referring now to FIG. 8, a method and system such as described above may be utilized in a media player 700. The media player 700 may include signal processing and/or control circuits, which are generally identified in FIG. 8 at 704, a WLAN interface 716, and a mass data storage device 710. A method and system for comparing unchanged and alternative data words to several values stored in a CAM device may be implemented in the signal processing and/or control circuits 704 and/or the WLAN interface 716 as part of a system to detect patterns in signals received via the WLAN or in data stored in the mass data storage 710, to detect malicious data such as viruses, worms, etc., for content filtering, for digital rights management, to prevent theft of personal or proprietary information, etc. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Figure 9:
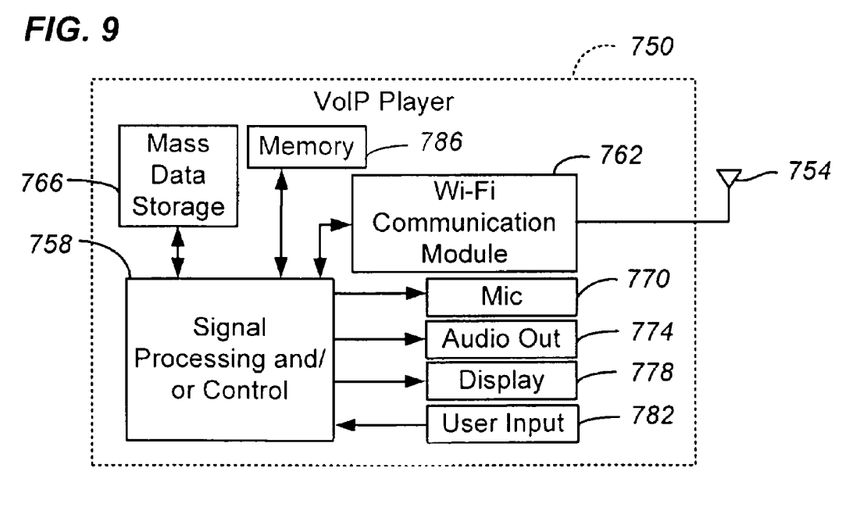
FIG. 9 is a block diagram of a voice over IP device that may utilize a method and system for comparing a data word to several values stored in a CAM device such as described herein.

Referring to FIG. 9, a method and system such as described above may be utilized in a Voice over Internet Protocol (VoIP) phone 750 that may include an antenna 754, signal processing and/or control circuits 758, a wireless interface 762, and a mass data storage 766. A method and system for comparing unchanged and alternative data words to several values stored in a CAM device described above may be implemented in the signal processing and/or control circuits 758 and/or the Wi-Fi communication module 762 as part of a system to detect patterns in signals received via the WLAN or in data stored in the mass data storage 766, to detect malicious data such as viruses, worms, etc., for content filtering, for digital rights management, etc. In some implementations, VoIP phone 750 includes, in part, a microphone 770, an audio output 774 such as a speaker and/or audio output jack, a display monitor 778, an input device 782 such as a keypad, pointing device, voice actuation and/or other input devices, and a Wireless Fidelity (Wi-Fi) communication module 762. Signal processing and/or control circuits 758 and/or other circuits (not shown) in VoIP phone 750 may process data, perform coding and/or encryption, perform calculations, format data and/or perform other VoIP phone functions.

Although the forgoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this disclosure, which would still fall within the scope of the claims.

What is claimed is:

1. A search engine, comprising:
   a storage module to store a plurality of data patterns;
   a plurality of busses to receive a plurality of representations of a search word including a first representation of the search word and a second representation of the search word, wherein the second representation of the search word is generated based on the first representation of the search word;
   a selector corresponding to at least one of the plurality of data patterns to select one of the plurality of representations of the search word for comparing to the at least one of the plurality of data patterns; and
   a logic circuit operatively coupled to the storage module, to the plurality of busses, and to the selector to compare the selected one of the plurality of representations of the search word to the at least one of the plurality of data patterns.

2. The search engine of claim 1, wherein the selector includes a one bit control input.

3. The search engine of claim 1, further comprising a plurality of selectors, each of the plurality of selectors corresponding to a respective one of the plurality of data patterns;
   wherein each of the plurality of selectors selects between the plurality of representations of the search word.

4. The search engine of claim 1, wherein the logic circuit compares at least some of the plurality of representations of the search word to at least some of the plurality of data patterns in parallel.

5. The search engine of claim 1, wherein the logic circuit includes a plurality of comparators, each of the plurality of comparators to independently compare one of the plurality of representations of the search word to a respective one of the plurality of data patterns.

6. The search engine of claim 5, wherein each of the plurality of comparators includes a set of sub-unit comparators to compare individual sub-units of one of the first representation of the search word or the second representation of the search word to corresponding sub-units of a respective one of the plurality of data patterns;
   wherein the storage module further comprises:
   a plurality of selectors to select between the first representation of the search word and the second representation of the search word, each of the plurality of selectors operatively coupled to a respective one of the plurality of comparators and associated with a respective one of the plurality of data patterns; and
   a ternary data storage coupled to enable inputs of the sub-unit comparators for at least one the plurality of data patterns.

7. The search engine of claim 1, further comprising a priority encoder coupled to the logic circuit to generate a match result indicative of whether at least one of the plurality data patterns matches a selected one of the first representation of the search word or the second representation of the search word.

8. The search engine of claim 1, further comprising a converter coupled to a first one of the plurality of busses and a second one of the plurality of busses to receive a first one of the plurality of representations of the search word via the first one of the plurality of busses, to generate a second one of the plurality of representations of the search word, and to propagate the second one of the plurality of representations of the search word via the second one of the plurality of busses.

9. The search engine of claim 1, wherein the storage module includes a content addressable memory (CAM) unit.

10. The search engine of claim 1, wherein the plurality of representations of the search word includes an unchanged representation of the search word and an alternative representation of the search word; wherein the logic circuit compares the unchanged representation of the search word and the alternative representation of the search word to respective ones of the plurality of data patterns.

11. The search engine of claim 10, wherein the logic circuit compares the unchanged representation of the search word and the alternative representation of the search word in parallel.

12. A method for determining whether a search word matches one or more of a plurality of data patterns stored in a content addressable memory, the method comprising:
   receiving a first representation of the search word;
   generating at least a second representation of the search word distinct from the first representation of the search word based on the first representation of the search word; and
   comparing the first representation and the second representation to the plurality of the data patterns.

13. The method of claim 12, wherein the plurality of the data patterns includes a first subset of data patterns and a second subset of data patterns; and wherein comparing the first representation and the second representation to the plurality of the data patterns includes comparing in parallel the first representation to the first subset of data patterns and the second representation to the second subset of data patterns.

14. The method of claim 13, further comprising:
   storing the first subset of data patterns in a first set of rows of a content addressable memory unit;
   storing the second subset of data patterns in a second set of rows of the content addressable memory unit; and
   wherein comparing in parallel the first representation to the first subset of data patterns and the second representation to the second subset of data patterns includes:
   communicating the first representation to the first set of rows via a first bus; and
   communicating the second representation to the first set of rows via a second bus.

15. The method of claim 12, wherein receiving a first representation of the search word includes receiving an unchanged representation of the search word; wherein generating at least a second representation of the search word includes generating a changed representation relative to the first representation of the search word; and wherein comparing the first representation and the second representation to the plurality of the data patterns includes comparing each of the changed representation and the unchanged to the plurality of data patterns.

16. The method of claim 12, wherein comparing the first representation and the second representation to the plurality of the patterns includes, for each of the plurality of patterns, selecting between the first representation and the second representation.

17. The method of claim 16, wherein comparing the first representation and the second representation to the plurality of the patterns further includes, for each of the plurality of patterns:
  receiving at least one ternary selector for the pattern; and
  enabling the comparing of the selected one of the first representation and the second representation to the one of the plurality of pattern based on the received at least one ternary selector.

18. The method of claim 16, wherein comparing the first representation and the second representation to the plurality of the patterns further includes comparing the first representation to at least one of the plurality of the patterns and comparing the second representation to at least another one of the plurality of the patterns.

19. The method of claim 12, wherein generating the second representation of the search word includes converting each American Standard Code for Information Interchange (ASCII) character included the first representation of the search word to a lower case ASCII character.

20. The method of claim 12, wherein generating the second representation of the search word includes converting each American Standard Code for Information Interchange (ASCII) character included the first representation of the search word to an upper case ASCII character.

\* \* \* \* \*